(12) United States Patent
Lee

(10) Patent No.: US 10,497,559 B2
(45) Date of Patent: Dec. 3, 2019

(54) METHOD FOR DEHYDRATING SEMICONDUCTOR STRUCTURE AND DEHYDRATING METHOD OF THE SAME

(71) Applicant: TAIWAN SEMICONDUCTOR MANUFACTURING COMPANY LTD., Hsinchu (TW)

(72) Inventor: Chung-Chieh Lee, Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/938,360

(22) Filed: Mar. 28, 2018

(65) Prior Publication Data
US 2019/0304773 A1    Oct. 3, 2019

(51) Int. Cl.
*F26B 5/06* (2006.01)
*H01L 21/02* (2006.01)
*H01L 21/3065* (2006.01)
*B08B 3/10* (2006.01)
*H01L 21/687* (2006.01)

(52) U.S. Cl.
CPC .......... *H01L 21/02057* (2013.01); *B08B 3/10* (2013.01); *F26B 5/06* (2013.01); *H01L 21/3065* (2013.01); *H01L 21/68764* (2013.01)

(58) Field of Classification Search
None
See application file for complete search history.

(56) References Cited

U.S. PATENT DOCUMENTS

| | | | | |
|---|---|---|---|---|
| 2,411,152 A * | 11/1946 | Folsom | ..................... | F26B 5/06 159/4.07 |
| 9,673,037 B2 * | 6/2017 | Sirard | ............... | H01L 21/02057 |
| 10,153,181 B2 * | 12/2018 | Sasaki | ........................ | B08B 3/02 |
| 2002/0005539 A1 * | 1/2002 | Whitman | .......... | H01L 21/76232 257/301 |
| 2013/0074764 A1 * | 3/2013 | Ishihara | ............ | H01L 21/67034 118/66 |
| 2018/0151348 A1 * | 5/2018 | Lee | ................... | H01L 21/02057 |

* cited by examiner

*Primary Examiner* — Shamim Ahmed
(74) *Attorney, Agent, or Firm* — WPAT, P.C., Intellectual Property Attorneys; Anthony King

(57) ABSTRACT

The present disclosure provides a method for dehydrating a semiconductor structure, including providing a semiconductive substrate, forming a trench on the semiconductive substrate, dispensing an agent in liquid form into the trench, solidifying the agent, and dehydrating a surface in the trench by transforming the agent from solid form to vapor form.

20 Claims, 12 Drawing Sheets

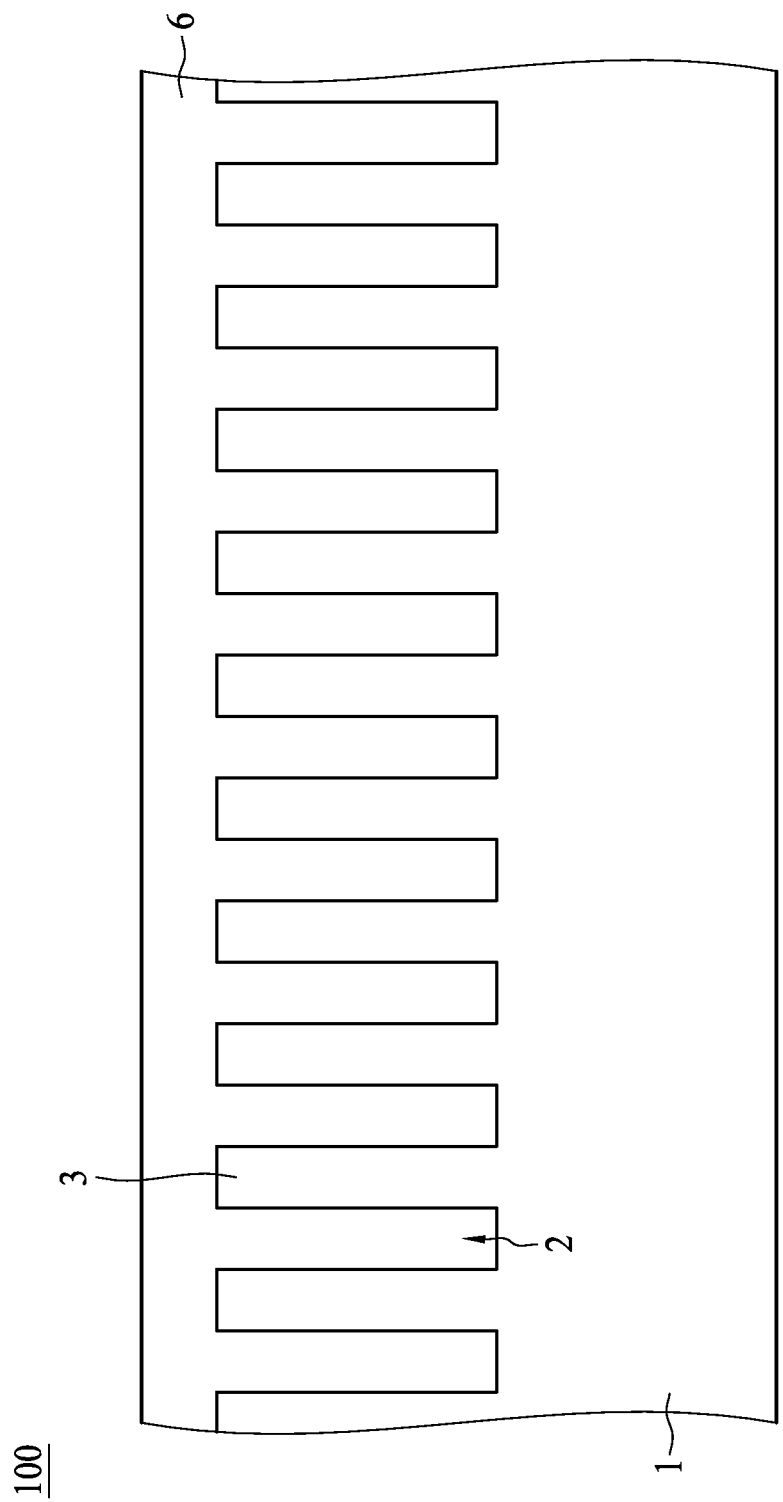

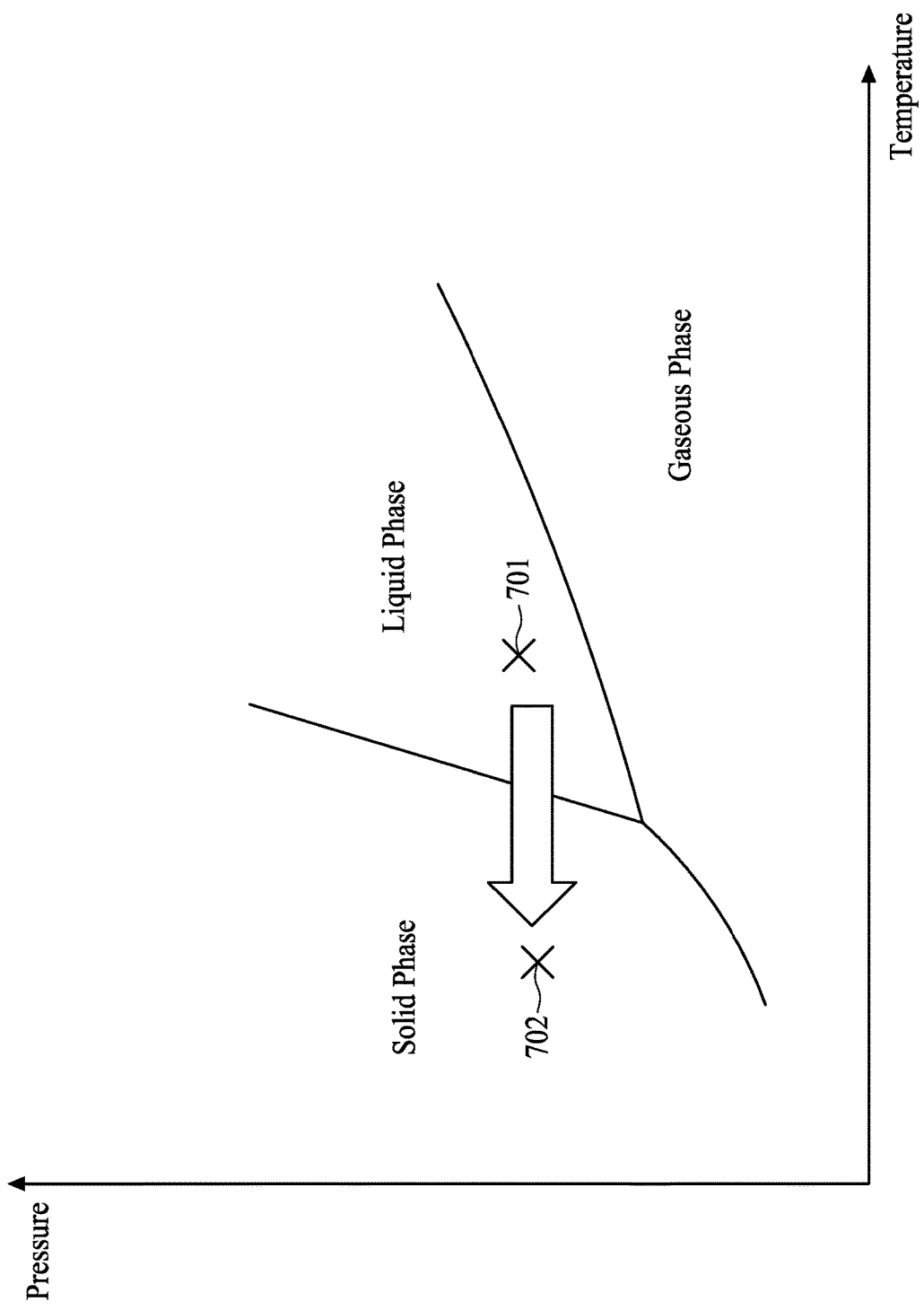

METHOD FOR DEHYDRATING SEMICONDUCTOR STRUCTURE AND DEHYDRATING METHOD OF THE SAME

BACKGROUND

As fabrication techniques for semiconductor integrated circuits continue to develop, the number of elements in a chip has increased. High aspect ratio fin structures were key elements to achieve required cell capacitance in the fabrication devices. However, after various kinds of aqueous processing of silicon wafers, residual moisture may be remained on the surface of wafers, thereby interfere the procedures in advance and induce defects; thence the wafers need to be dehydrated after aqueous processes in order to alleviate the defects on fin structures caused by residual moisture.

Conventionally, the dehydration process includes spinning the wafer at high speed, as the water can be spun off the wafer edge by centrifugal force. However, the fin structures with high aspect ratio are weak and prone to be damaged throughout the process of spinning due to the surface tension applied by water on the fin structures. The pattern of the fin structures may collapse and induce defect after dehydration processes. Furthermore, the collapsed fin structures cannot be effectively recovered hitherto.

According to Young-Laplace equation, the Laplace pressure between an air-liquid interface has a positive correlation with surface tension, contact angle, and distance between two given fin structures. Meanwhile the pattern deflection has a positive correlation with pattern height, aspect ratio, contact angle, and Laplace pressure. Therefore surface tension and contact angle are two of the major factors to be solved pertinent to pattern deflection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is cross sections of substrate dehydration at various stages, in accordance with some embodiments of the present disclosure.

FIG. 5A is a phase diagram illustrating substrate dehydration at various stages, in accordance with some embodiments of the present disclosure.

DETAILED DESCRIPTION

Figure 1A:
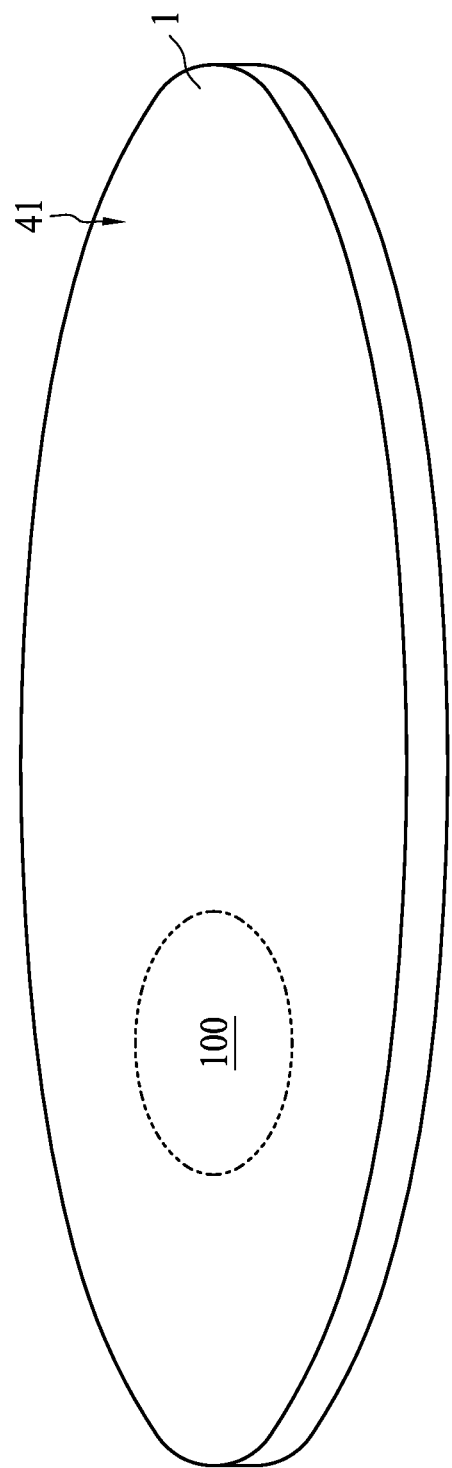
FIG. 1A is schematic diagram of a given area on a substrate, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure provides a method for wafer dehydration. The present disclosure helps to remove residual moisture on the wafer and reduce pattern collapse throughout the process of dehydration.

Figure 1B:
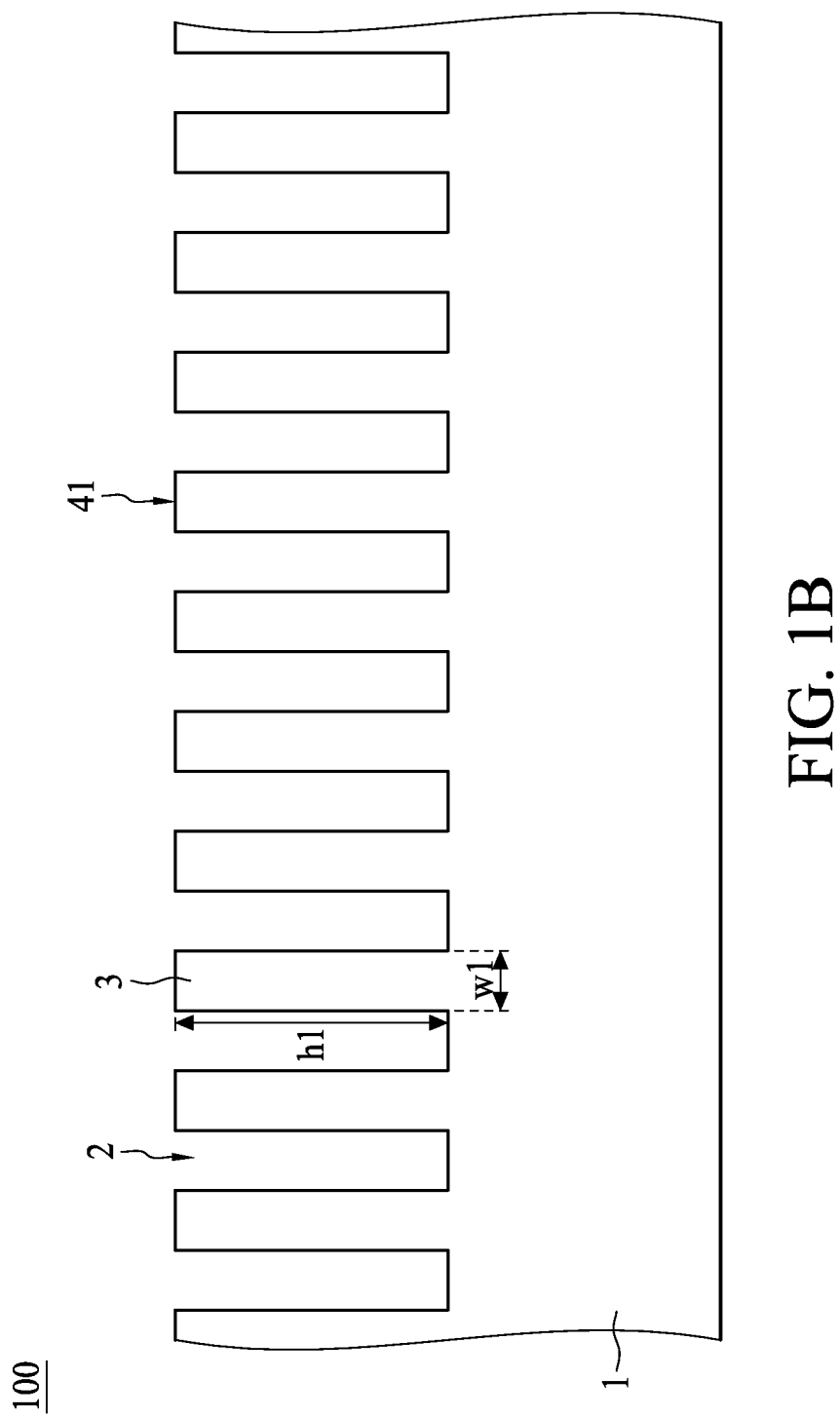
FIG. 1B is cross sections of substrate dehydration at various stages, in accordance with some embodiments of the present disclosure.

FIG. 1A illustrates a schematic diagram of a substrate 1 in accordance with some embodiments. The substrate 1 may be a semiconductive substrate, dielectric substrate, silicon dioxide substrate, aluminum oxide substrate, bulk silicon substrate, epitaxial silicon substrate, silicon germanium substrate, silicon carbide substrate, sapphire substrate, germanium, gallium arsenide substrate, indium phosphide substrate, oxide substrate, nitride substrate, or other group III-V compound substrate. Within a first area 100, a plurality of trenches 2 and a plurality of fins 3 are formed on a first side 41 of the substrate 1, as shown in FIG. 1B. In some embodiments, the plurality of trenches 2 and fins 3 can be formed by any suitable process including photolithography, deep reactive-ion etching, various deposition processes, various etching processes, or the like. In some embodiments, the plurality of trenches 2 can be a trench array. In some embodiments, the trench array is in a cell region of a semiconductive chip. In some embodiments, the trench array is in an I/O region of a semiconductive chip. In some embodiments, the plurality of fins 3 can be a fin array. An exemplary photolithography process includes forming a photoresist layer overlaying the substrate 1, exposing the resist to a pattern, performing a post-exposure bake process, and developing the resist to form a masking element including the resist. The masking element is etched using reactive ion etching (RIE) processes and/or other suitable processes. In some embodiments, the plurality of fins 3 are formed by patterning and etching a portion of the substrate 1.

Referring to FIG. 1B, at least one fin of the plurality of fins 3 has an aspect ratio, that is, a height hi to width w1 ratio of the protrusion, greater than 11. In some embodiments, at least one fin of the plurality of fins 3 has a Young's modulus lower than 200 GPa. The resistance against deflection of a given fin structure has a negative correlation to the aspect ratio per se, as the resistance against deflection of a given fin structure has a positive correlation to the Young's modulus of the given fin structure. In other words, a given fin structure of the plurality of fins 3 is more prone to be deflected by external force if the given fin structure has a higher aspect ratio or a lower Young's modulus.

After forming the plurality of trenches 2 and the plurality of fins 3, the first side 41 of the substrate 1 is cleaned. In some embodiments, the cleaning process includes using various acidic chemical, alkaline chemical, deionized water, and/or reactive oxygen solution. In some embodiments, particles and metallic contamination may be removed by applying a mixture of deionized water, ammonium hydroxide ($NH_4OH$), and aqueous hydrogen peroxide ($H_2O_2$). However this mixture may result in the formation of a thin silicon oxide layer along with metallic contamination. In some embodiments, hydrogen fluoride (IHF) can be used to remove a thin oxide layer and some fraction of ionic contaminants. A mixture of sulfuric acid ($H_2SO_4$) and aqueous hydrogen peroxide ($H_2O_2$) can be used to remove bigger size organic residues off the substrate 1. The mixture of deionized water, aqueous hydrochloric acid (HCl), and aqueous hydrogen peroxide ($H_2O_2$) can be used to remove traces of metallic ion containments.

In some embodiments, after the cleaning process, a surface of the plurality of trenches 2 and a surface of the plurality of fins 3 are converted into hydrophobic surfaces. In some embodiments, dilute hydrofluoric acid is dispensed from the first side 41 of the substrate 1 to flow through the surface of the plurality of trenches 2 and the surface of the plurality of fins 3. Diluted hydrogen fluoride acid (HF) is used to remove a thin film of the substrate 1 and form silicon-fluorine bonds with the exposed surface, leaving behind hydrophobic surfaces. After the treatment, the hydrogen oxide molecules on the first side 41 have a higher tendency to bond to other hydrogen oxide molecules rather than bonding with the first side 41 of the substrate 1, hydrogen oxide molecules are easier to be removed on hydrophobic surfaces, thus forming hydrophobic surfaces helps improve the effectiveness of the following dehydration process.

Figure 2:
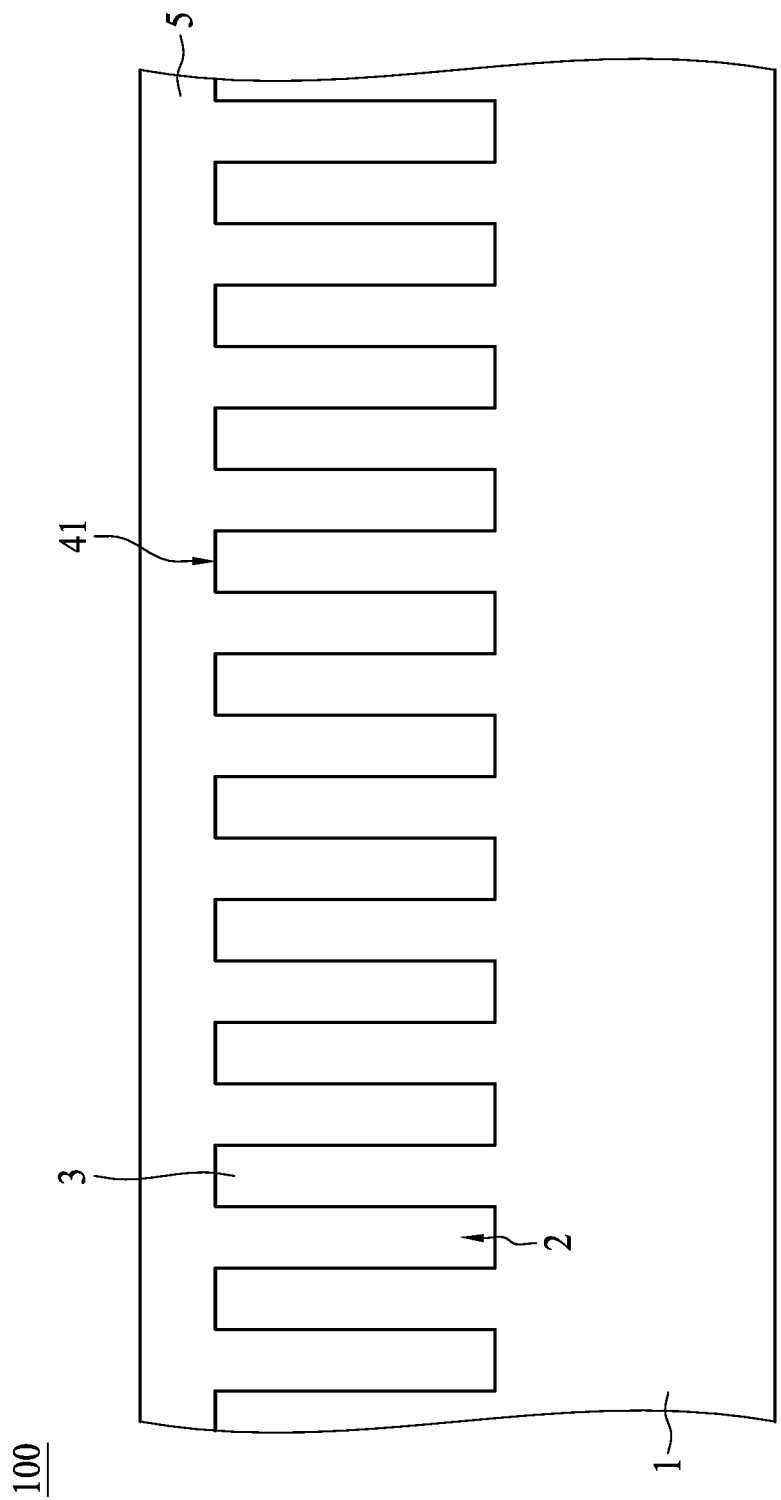
FIG. 2 is cross sections of substrate dehydration at various stages, in accordance with some embodiments of the present disclosure.

Referring to FIG. 2, in some embodiments, the creation of hydrophobic surfaces may be followed by a deionized water 5 rinsing process. The deionized water 5 may be dispensed into the plurality of trenches 2 and flowed through spaces between the plurality of fins 3. The deionized water 5 removes residual diluted hydrogen fluoride acid (HTF) and further covers above the first side 41.

Referring to FIG. 3, in some embodiments, before dehydrating the substrate 1, a liquidus solvent 6 is dispensed into the plurality of trenches 2 and flowed through spaces between the plurality of fins 3. The liquidus solvent 6 is miscible with dionized water 5, therefore the liquidus solvent 6 can substantially displace the deionized water 5 inside the plurality of trenches 2 and above the first side 41. In some embodiments, the liquidus solvent 6 includes isopropyl alcohol (IPA).

Figure 4A:
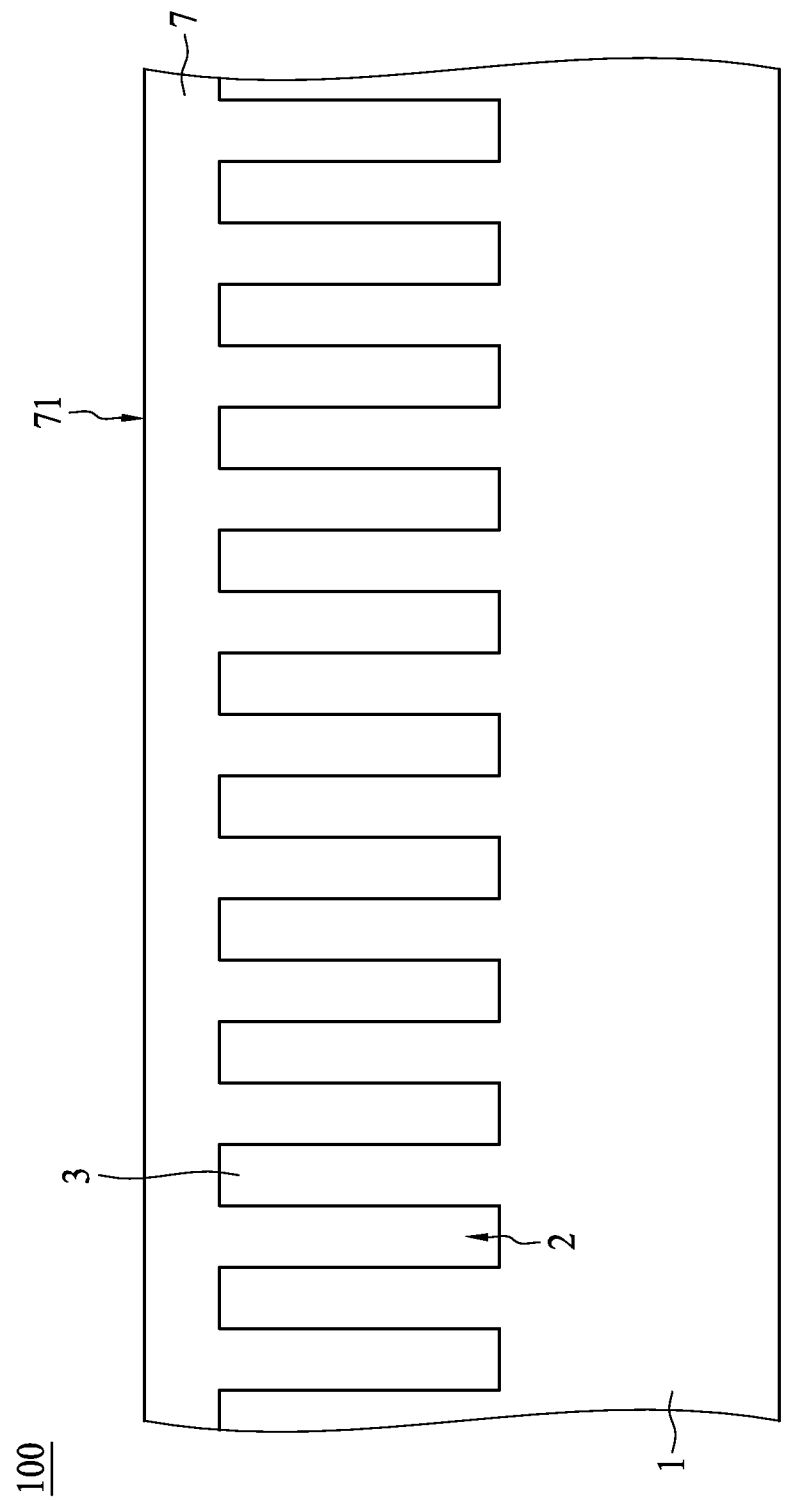
FIG. 4A is cross sections of substrate dehydration at various stages, in accordance with some embodiments of the present disclosure.
Figure 4B:
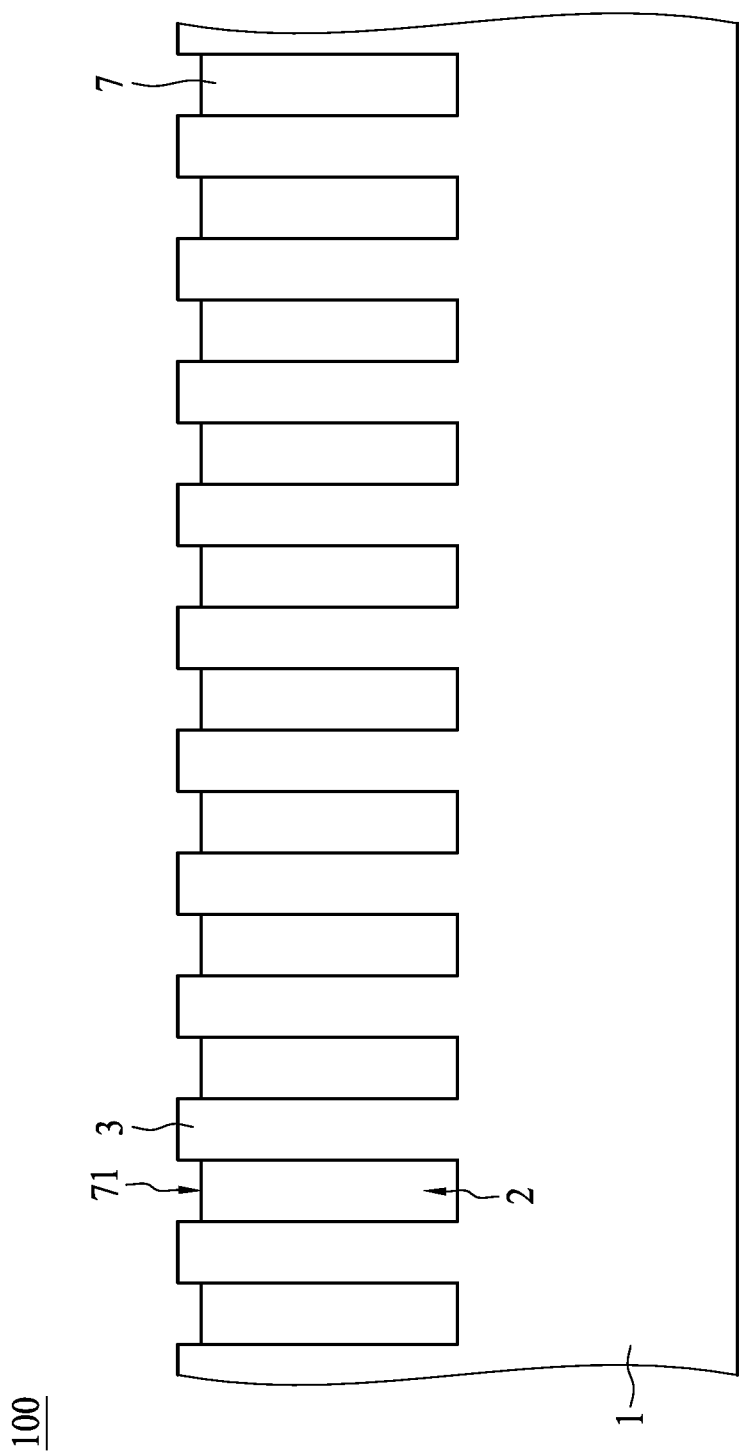
FIG. 4B is cross sections of substrate dehydration at various stages, in accordance with some embodiments of the present disclosure.

Referring to FIG. 4A, in some embodiments, an agent 7 in liquid form is dispensed into the plurality of trenches 2 and flowed in the spaces between the plurality of fins 3. The agent 7 can displace the liquidus solvent 6 inside the plurality of trenches 2. In some embodiments, the agent 7 is completely filled in the plurality of trenches 2, as a first surface 71 of the agent 7 is above or aligned with the first side 41 of the substrate 1. While in some embodiments, the agent 7 is partially filled in the plurality of trenches 2, as a first surface 71 of the agent 7 is below the first side 41 of the substrate 1, as shown in FIG. 4B. In some embodiments, the agent 7 in liquid form is miscible with liquidus solvent 6, therefore the liquidus solvent 6 can be substantially displaced by the agent 7 in liquid form inside the plurality of trenches 2 and above the first side 41.

A phase diagram in FIG. 5A illustrates the process of the agent 7 in liquid form being cooled down and transformed into an agent in solid form 7'. When the agent 7 is in liquid form, it is represented as a dot 701 within the liquid phase in the phase diagram. In some embodiments, the temperature of the agent 7 in liquid form is lowered, as the amount of heat is great enough that the attractive forces between molecules of the agent 7 in liquid form draws together. Thereby the state of the agent 7 changes from liquid form to solid form. As shown in the phase diagram, the state of the agent 7 moves from the dot 701 to a dot 702 within the solid phase area, wherein the dot 701 and the dot 702 are separated by the liquid-solid phase boundary. In some embodiments, the process of cooling down the agent 7 includes purging a coolant 72 on a surface of the substrate 1. The coolant 72 may absorb heat and carry heat away from the substrate 1. In some embodiments, the coolant 72 may include deionized water (DI), isopropyl alcohol (IPA), mixtures of isopropyl alcohol (IPA) and deionized water (DI), perfluoropolyether (PFPE), heavy water, refrigerant, cooling air, inert gases, ethylene glycol ($C_2H_6O_2$), liquid metals, fluorocarbons, propylene glycol ($C_3H_8O_2$), methanol solution, ethanol solution, aliphatics, calcium chloride solution, potassium formate, acetate solution, carbon dioxide, liquid nitrogen, liquid oxygen, liquid hydrogen, nanofluid, freon, silicones, silicate-ester, aromatic hydrocarbon, liquidus polymer, or the like. While in some embodiments, the process of cooling down may include indirect contact between the substrate 1 and a plurality of cooling pipes or solid coolers. The form of the coolant 72 is not limited herein; any liquid, gas, or compounds that can sustain at a predetermined temperature stably are under consideration.

Figure 5B:
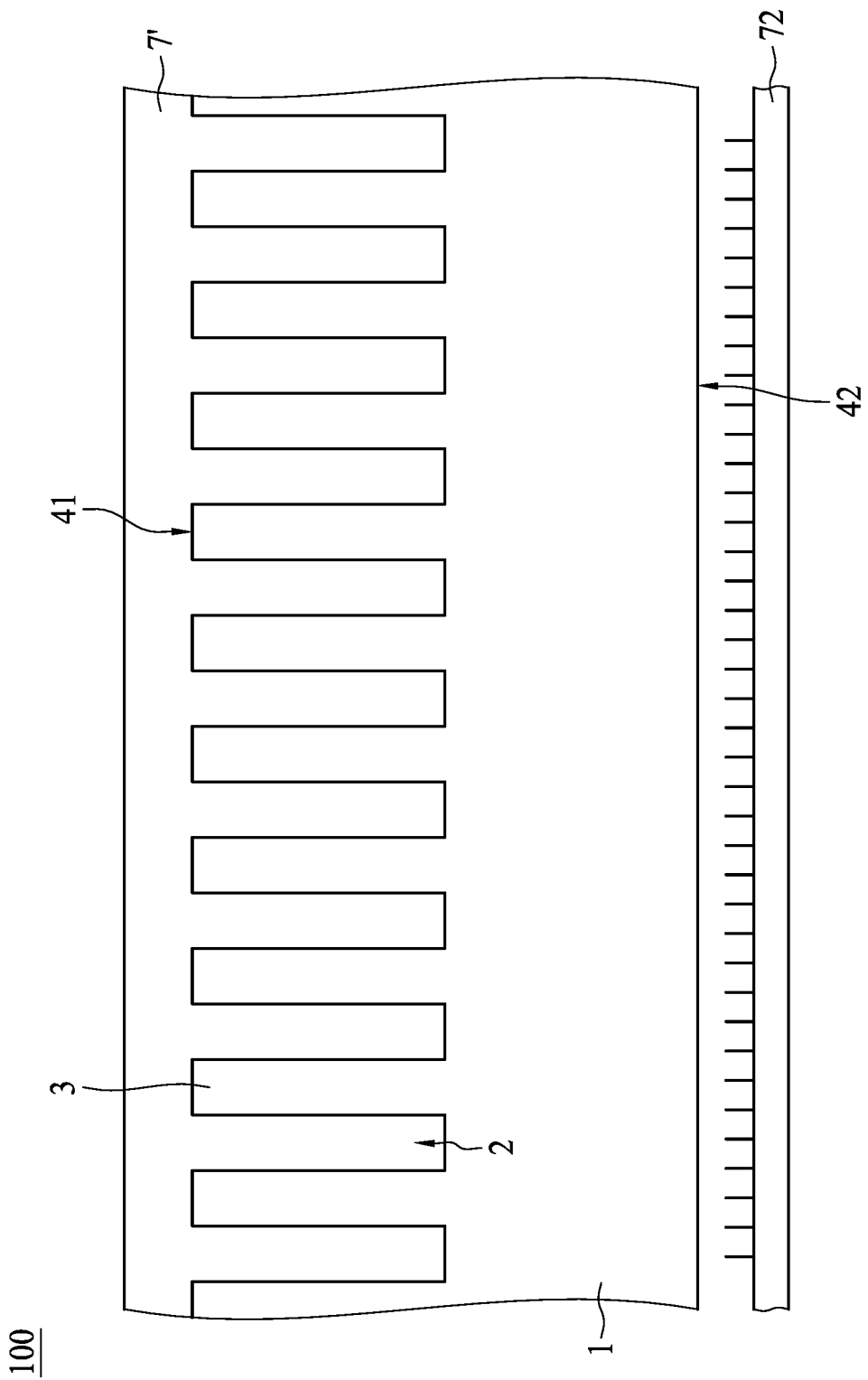
FIG. 5B is cross sections of substrate dehydration at various stages, in accordance with some embodiments of the present disclosure.

Referring to FIG. 5B, in some embodiments, the coolant 72 is purged at a second side 42 opposite to the first side 41 of the substrate 1 after the agent 7 in liquid form is dispensed over the first side 41 of the substrate 1. In order to obtain a more stable solidified agent 7', the melting point of the agent 7 is rather higher, ranging from 0° C. to 25° C. under pressure 1 atm; while a temperature of the agent 7 is lowered to at least 5 degrees below the melting point of the agent 7. The agent 7 transfers from liquid form to solid form 7'. The coolant 72 possesses a temperature of at least 5 degrees below the melting point of the agent 7 before being purged.

While in some other embodiments, the coolant 72 may be purged at the second side 42 opposite to the first side 41 of the substrate 1 before the agent 7 in liquid form is dispensed over the first side 41 of the substrate 1. In order to shorten the stint of the cooling process, the coolant 72 can preliminarily cool down the second side 42 of the substrate 1. After the dispensing of the agent 7 is finished, a temperature of the agent 7 is lowered to at least 5 degrees below the melting point of the agent 7, thence agent 7 transfers from liquid form to solid form 7'. The coolant 72 possesses a temperature of at least 5 degrees below the melting point of the agent 7 before being purged.

While in some other embodiments, the coolant 72 may also be purged at the second side 42 opposite to the first side 41 of the substrate 1 while the agent 7 in liquid form is being dispensed over the first side 41 of the substrate 1. After the dispensing of the agent 7 is finished, a temperature of the agent 7 is lowered to at least 5 degrees below the melting point of the agent 7, thence agent 7 transfers from liquid form to solid form 7'. The coolant 72 possesses a temperature of at least 5 degrees below the melting point of the agent 7 before being purged.

Figure 5C:
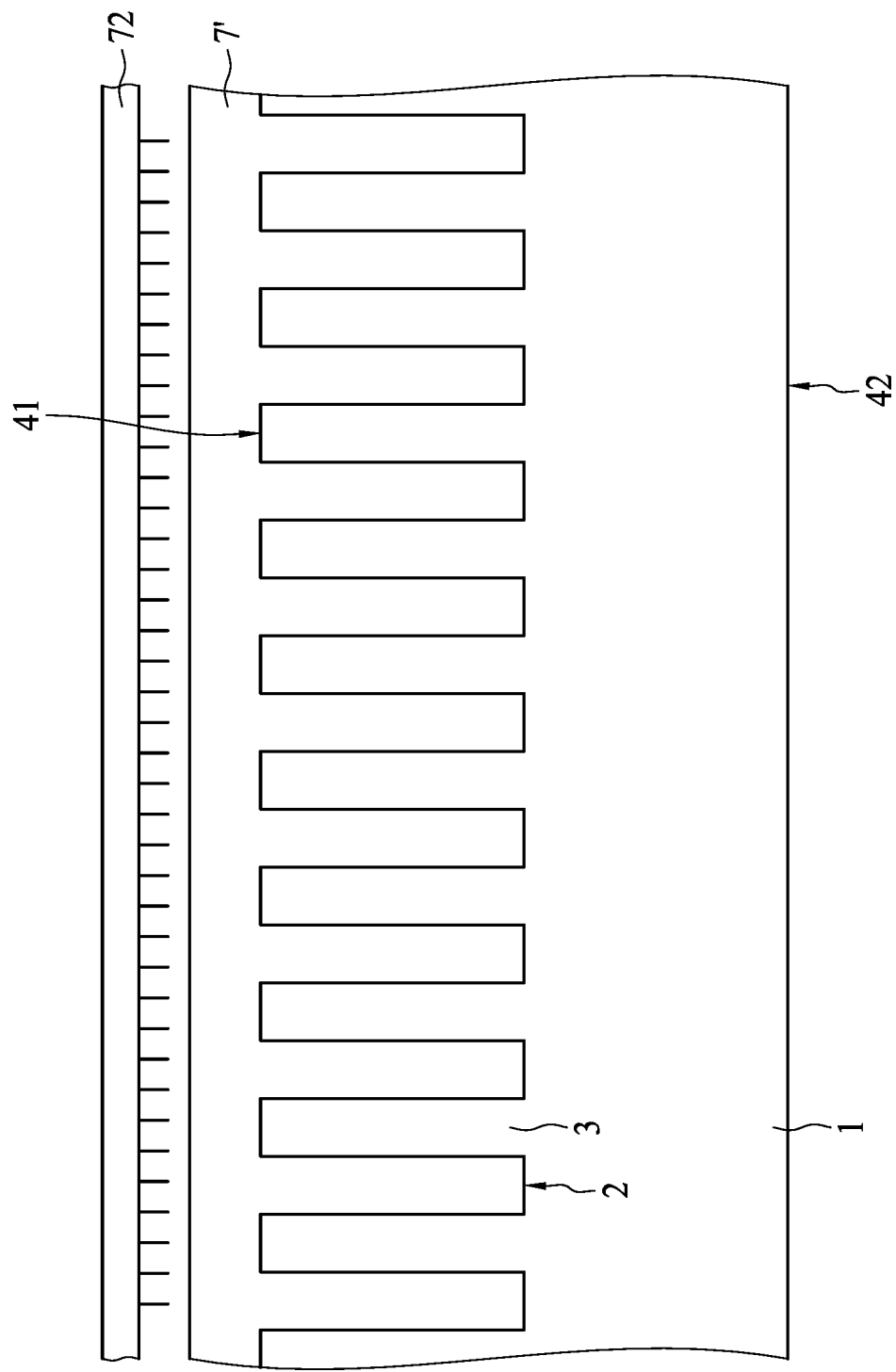
FIG. 5C is cross sections of substrate dehydration at various stages, in accordance with some embodiments of the present disclosure.

Referring to FIG. 5C, in some embodiments, the coolant 72 is purged at the first side 41 of the substrate 1 after the agent 7 in liquid form is dispensed over the first side 41 of the substrate 1. In order to obtain a more suitable solidified agent 7', as will be discussed in FIG. 6A, the melting point of the agent 7 is rather higher, ranging from 0° C. to 25° C. under pressure 1 atm; while a temperature of the agent 7 is lowered to at least 5 degrees below the melting point of the agent 7. The agent 7 transfers from liquid form to solid form 7'. The coolant 72 possesses a temperature of at least 5 degrees below the melting point of the agent 7 before being purged.

While in some other embodiments, the coolant 72 may be purged at the first side 41 of the substrate 1 before the agent 7 in liquid form is dispensed over the first side 41 of the substrate 1. In order to shorten the stint of the cooling process, the coolant 72 can be preliminarily cool down the first side 41 of the substrate 1 to a temperature above the melting point of the agent 7. After the dispensing of the agent 7 is finished, a temperature of the agent 7 is lowered to at least 5 degrees below the melting point of the agent 7, thence the agent 7 transfers from liquid form to solid form 7'. The coolant 72 possesses a temperature of at least 5 degrees below the melting point of the agent 7 before being purged.

While in some other embodiments, the coolant 72 may also be purged at the first side 41 of the substrate 1 while the agent 7 in liquid form is being dispensed over the first side 41 of the substrate 1. After the dispensing of the agent 7 is finished, a temperature of the agent 7 is lowered to at least 5 degrees below the melting point of the agent 7, thence agent 7 transfers from liquid form to solid form 7'. The coolant 72 possesses a temperature of at least 5 degrees below the melting point of the agent 7 before being purged.

Figure 6A:
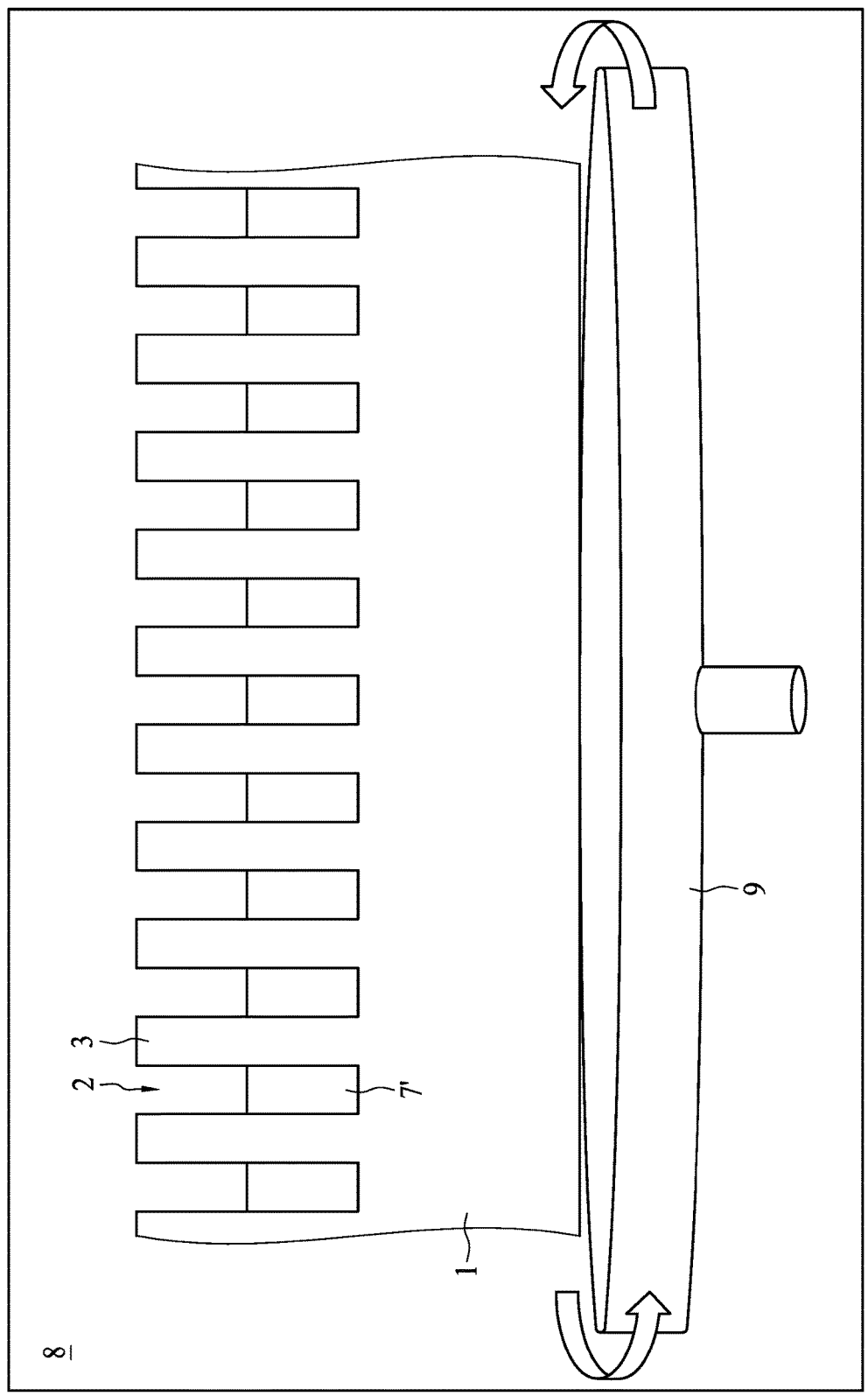
FIG. 6A is cross sections of substrate dehydration at various stages, in accordance with some embodiments of the present disclosure.

Referring to FIG. 6A, the surfaces of the plurality of trenches 2 and the plurality of fins 3 may be dehydrated by vaporizing the solidified agent 7'. As the solidified agent 7' transforming from solid form directly to vapor form, the residual moisture on the surfaces of the plurality of trenches 2 and the fins 3 may be removed at the same time. In order to vaporize the solidified agent 7' within rational processing stint, the solidified agent 7' may possess a high saturated vapor pressure. Under the circumstances of 1 atm, 5 degrees below the melting point of the agent 7, the saturated vapor pressure of the solidified agent 7' must be at least above 1 kPa, as will be explained subsequently. In some embodiments, the solidified agent 7' absorbs heat throughout the process of vaporizing.

The vapor pressure is an indication of the vaporization rate of the solidified agent 7'. The vapor pressure relates to the tendency of particles to escape from the solid phase. A substance with a high vapor pressure at given temperatures is often referred to be rather volatile. The vapor pressure of the solidified agent 7' is the pressure exhibited by vapor form of the agent 7 above solid surface. The saturated vapor pressure is the pressure when the rate of vaporization of the solidified agent 7' matches the rate of deposition of the vapor form of the solidified agent 7'. Herein the saturated vapor pressure of the solidified agent 7' is the pressure exerted by vapor form in thermodynamic equilibrium with the solid form at a given temperature, at least 5 degrees below the melting point of the agent 7, in a closed system.

Meanwhile, most common solid substances possess minimal saturated vapor pressure, thereby difficult to realize the process of vaporizing directly from solid form to vapor form within a rational processing time. Therefore under the circumstances of 1 atm and 5 degrees below the melting point of the agent 7, the material of the agent 7 must possess a solid-vapor saturated vapor pressure at least greater than 1 kPa.

However, most common substances do not possess high melting point and high saturated vapor pressure concurrently. Under the limitation of a melting point ranging from 0° C. to 25° C. under pressure 1 atm, and a saturated vapor pressure at least 1 kPa under a temperature of at least 5 degrees below the melting point of the agent 7, dimethyl carbonate ($C_3H_6O_3$), ethanoic acid ($CH_3COOH$), cyclohexane ($C_6H_{12}$), pivaldehyde ($C_5H_{10}O$), tert-butanol ($C_4H_{10}O$), p-xylene ($C_8H_{10}O$), cyclooctane ($C_8H_{16}O$), and cosolvents of the above substances, for example cosolvent of dimethylcarbonate and tert-butanol, cosolvent of pivaldehyde and cyclooctane, are some of the suitable materials of the agent 7.

Figure 6B:
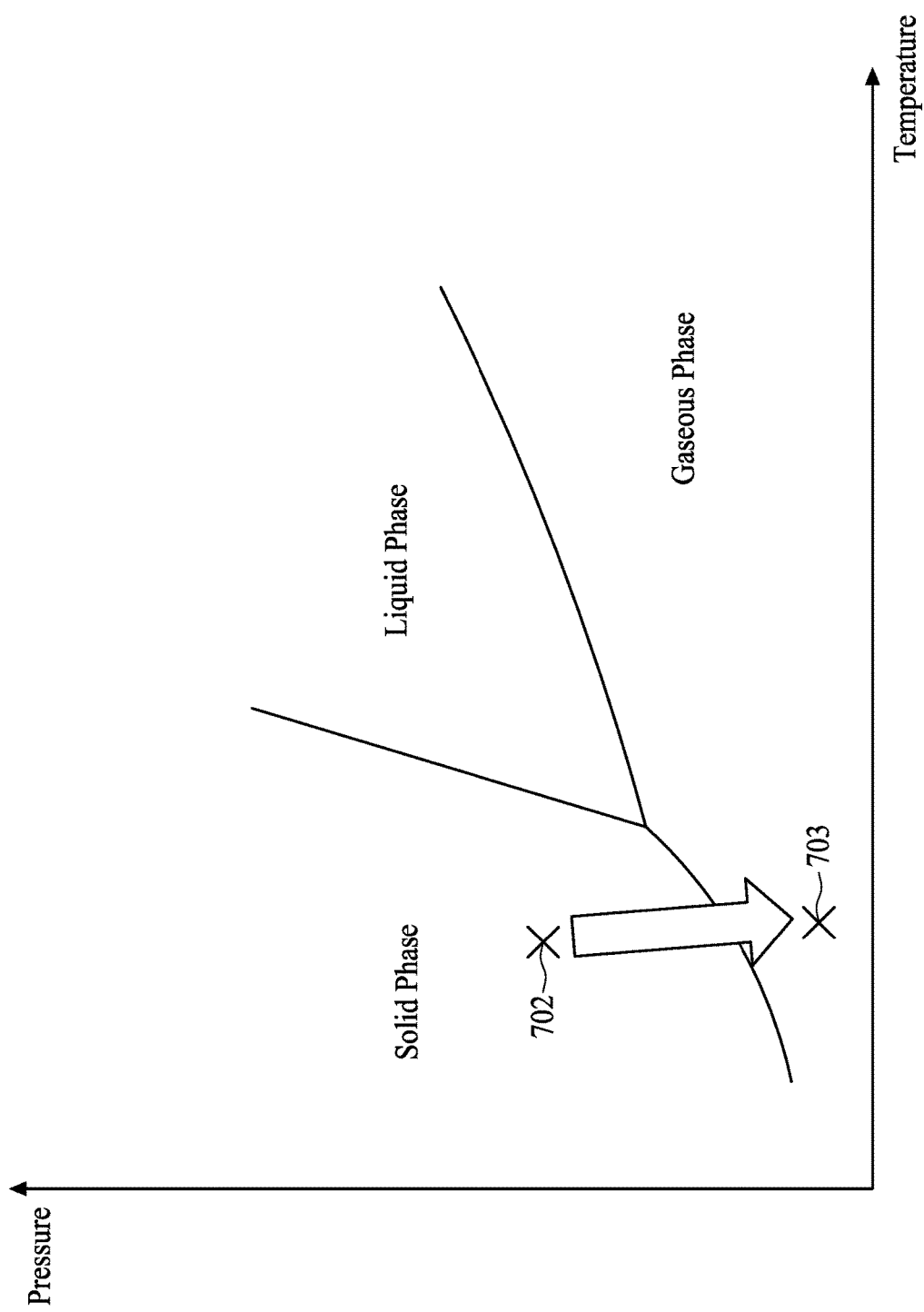
FIG. 6B is a phase diagram illustrating substrate dehydration at various stages, in accordance with some embodiments of the present disclosure.

During the phase transition from solid form 7' to vapor form, the process does not pass through the intermediate liquid phase, as shown in FIG. 6B. The state of the solidified agent 7' moves from dot 702 to a dot 703 within the gaseous phase, wherein the dot 702 and dot 703 are separated by the solid-gaseous phase boundary. Therefore the melting point of the agent 7 must be rather higher, ranging from 0° C. to 25° C. under pressure 1 atm. Thence it is easier to realize a solid-to-vapor transformation without lowering the temperature of the agent 7 to an extremely low degree.

In addition, the pressure in phase diagram (y-axis in FIG. 6B) refers to the partial pressure of the agent 7 in vapor form, not the total (e.g. atmospheric) pressure of the entire system. In other words, the partial pressure of the agent 7 in vapor form is lowered during the process of vaporizing the solidified agent 7'. Also as Le Chatelier's principle stated, if a dynamic equilibrium is disturbed by changing the conditions, the position of equilibrium shifts to counteract the change to reestablish equilibrium. If a given vapor experiences a change in partial pressure or concentration, the tendency shifts in the opposite direction to offset the change. In other words, lowering the partial vapor pressure of agent 7 in vapor form may stimulate the vaporization process of the solidified agent 7'.

Referring back to FIG. 6A, in some embodiments, the dehydration process for substrate 1 is performed inside an enclosed chamber 8. As previously discussed, the saturated vapor pressure of the solidified agent 7' is the pressure when the rate of vaporization of the solidified agent 7' matches the rate of deposition of the vapor form of the solidified agent 7'. Therefore, in order to expedite the rate of vaporization of the solidified agent 7', a partial vapor pressure of the agent 7 in vapor form inside the chamber 8 can be lowered. In some embodiments, the pressure inside the chamber 8 can be lowered negative pressure.

Still referring to FIG. 6A, in some embodiments, lowering the partial vapor pressure of the agent 7 in vapor form inside the chamber 8 may include purging nitrogen gas ($N_2$) into the chamber 8 (not shown in FIG. 6A). As the partial pressure of the nitrogen gas ($N_2$) inside the chamber 8 increases, the partial pressure of the agent 7 in vapor form decreases accordingly. Thence the tendency shifts in the opposite direction to offset the decreasing partial pressure of the agent 7 in vapor form, as the vaporization process of the solidified agent 7' may be stimulated.

In some embodiments, lowering the partial vapor pressure of the agent 7 in vapor form inside the chamber 8 may include purging superheated hydrogen oxide steam ($H_2O$) into the chamber 8 (not shown in FIG. 6A). Herein the hydrogen oxide molecules of the superheated hydrogen oxide steam ($H_2O$) are all remain in gaseous state. As the partial pressure of superheated hydrogen oxide steam ($H_2O$) inside the chamber 8 increases, the partial pressure of the agent 7 in vapor form decreases accordingly. Thence the tendency shifts in the opposite direction to offset the decreasing partial pressure of the agent 7 in vapor form, as the vaporization process of the solidified agent 7' may be stimulated. However, any gas that can be purged inside the chamber without inducing any unintentional chemical reaction with the substrate 1 is within consideration to be applied herein. In some embodiments, in order to expedite the vaporizing process of the solidified agent 7', the substrate 1 is spun by a chuck spinner 9. In some embodiments, the chuck spinner 9 may create partial vacuum or negative air pressure, and secure the substrate 1 by suction force. While in some other embodiments, the chuck spinner 9 may secure the substrate 1 by utilizing electrostatic force. While in some other embodiments, the chuck spinner 9 may secure the substrate 1 by utilizing magnetic force. The chuck spinner 9 may transmit torque of a motor (not shown in FIG. 6A) to the substrate 1, and drive the substrate 1 to rotate synchronously. In some embodiments, spinning the substrate 1 helps improve the uniformity of the vaporization process.

In some other embodiments, lowering the partial vapor pressure of the agent 7 in vapor form inside the chamber 8 may include exhausting the agent 7 in vapor form from the chamber 8. The agent 7 in vapor form may be exhausted from the chamber 8 through one or more suction pipes (not shown in FIG. 6A). The partial pressure of the agent 7 in vapor form decreases. Thence the tendency shifts in the opposite direction to offset the decreasing partial pressure of the agent 7 in vapor form, as the vaporization process of the solidified agent 7' may be stimulated. In some embodiments, in order to expedite the vaporizing process of the solidified agent 7', the substrate 1 is spun by a chuck spinner 9. In some embodiments, the chuck spinner 9 may create partial vacuum or negative air pressure, and secure the substrate 1 by suction force. While in some other embodiments, the chuck spinner 9 may secure the substrate 1 by utilizing electrostatic force. While in some other embodiments, the chuck spinner 9 may secure the substrate 1 by utilizing magnetic force. The chuck spinner 9 may transmit torque of a motor (not shown in FIG. 6A) to the substrate 1, and drive the substrate 1 to rotate synchronously.

Figure 7:
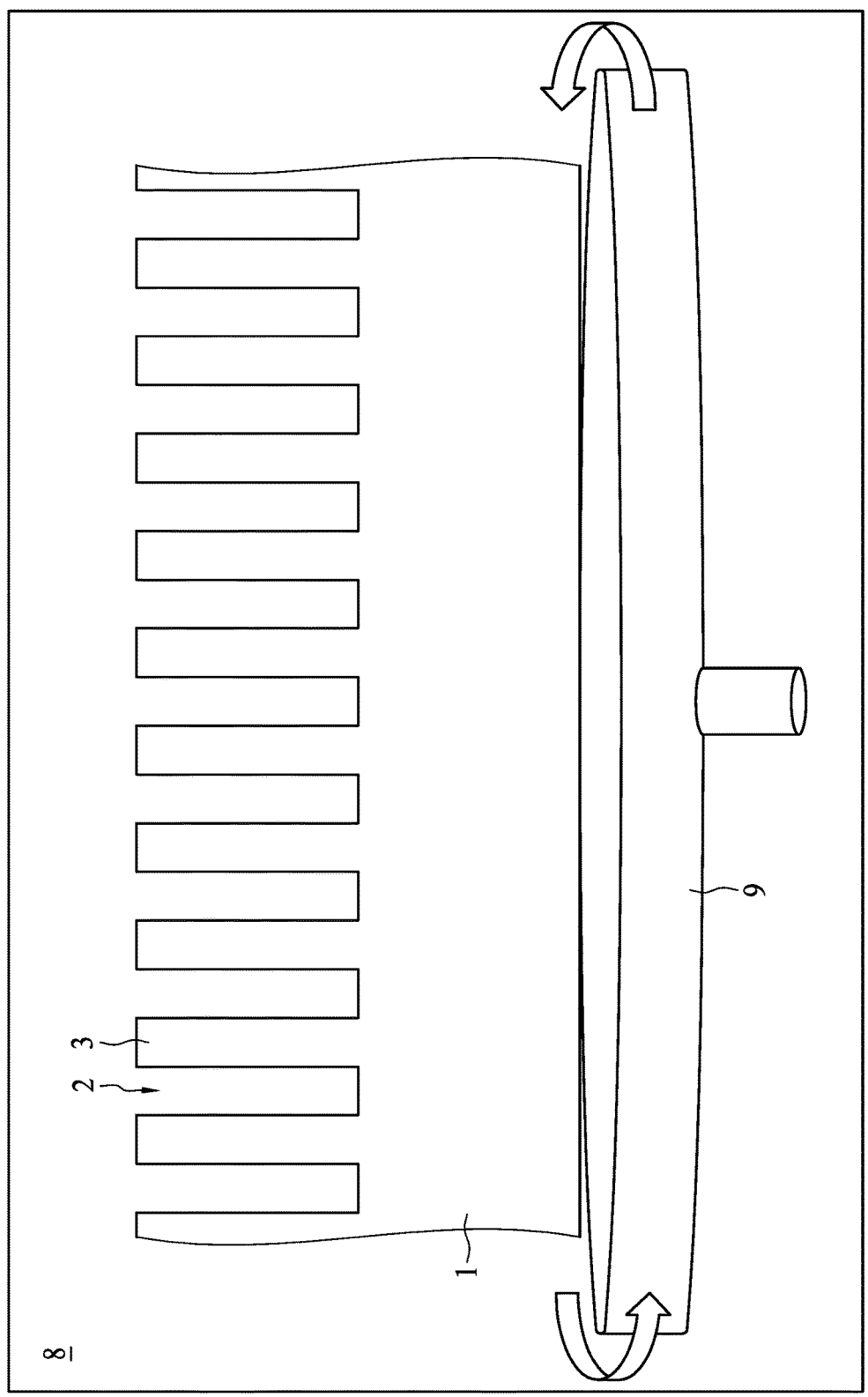
FIG. 7 is cross sections of substrate dehydration at various stages, in accordance with some embodiments of the present disclosure.

As previously discussed in FIG. 6B, the solidified agent 7' does not turn into intermediate liquid state during the process of vaporization, thence there will be no air-liquid interface tension applying on the plurality of fins 3 during removing the agent 7. Referring to FIG. 7, as the solidified agent 7' being vaporized and completely removed, the surfaces of the plurality of fins 3 and the plurality of trenches 2 are exposed.

After the dehydration process, the substrate 1 including the fins 3 and/or the trenches 2 can be used in metal gate process, double-gate transistor process, multigate device process, 3D FinFET process, planar FinFET process, gate-all-around process, field-effect transistors process, memory device manufacturing, microprocessor manufacturing, transistor fabrication, display drivers manufacturing, nanowiring, planar transistors manufacturing, processing unit manufacturing, integrated circuit manufacturing, optical device manufacturing, or the like.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a method for dehydrating a semiconductor structure, including providing a semiconductive substrate, forming a trench on the semiconductive substrate, dispensing an agent in liquid form into the trench, solidifying the agent, and dehydrating a surface in the trench by transforming the agent from solid form to vapor form.

Some embodiments of the present disclosure provide a method for dehydrating a semiconductor structure, including providing a semiconductive substrate, partially removing the semiconductive substrate to form a plurality of fins, flowing an agent in spaces between the plurality of fins, solidifying the agent in the spaces, and transforming the solidified agent into vapor.

Some embodiments of the present disclosure provide a method for dehydrating a semiconductor structure, including providing a semiconductive substrate, forming a trench array on the semiconductive substrate, dispensing an agent in liquid form into the trench array, solidify the agent, and vaporizing the agent from solid form to vapor form inside a chamber.

What is claimed is:

1. A method for dehydrating a semiconductor structure, comprising:
    providing a semiconductive substrate;
    forming a trench on the semiconductive substrate;
    dispensing diluted fluoride into the trench;
    dispensing deionized water into the trench subsequent to dispensing diluted fluoride;
    dispensing isopropanol into the trench subsequent to dispensing deionized water;
    dispensing an agent in liquid form into the trench subsequent to dispensing isopropanol;
    solidifying the agent; and
    dehydrating a surface in the trench by transforming the agent from solid form to vapor form.

2. The method of claim 1, wherein solidifying the agent includes cooling the substrate.

3. The method of claim 1, wherein solidifying the agent is through lowering a temperature of the agent to at least 5 degrees below a melting point of the agent.

4. The method of claim 2, wherein cooling the substrate is performed by purging a coolant on a surface of the semiconductive substrate.

5. The method of claim 4, wherein the surface is at an opposite side to the trench.

6. The method of claim 1, further comprising spinning the substrate after solidifying the agent.

7. The method of claim 1, wherein a melting point of the agent is ranging from 0° C. to 25° C. under pressure 1 atm.

8. The method of claim 1, wherein a saturated vapor pressure of the agent under pressure 1 atm and 5 degrees below the melting point is at least 1 kPa.

9. A method for dehydrating a semiconductor structure, comprising:
    forming a semiconductive transistor, comprising:
        providing a semiconductive substrate;
        forming a plurality of semiconductive fins over the semiconductive substrate;
    flowing an agent in spaces between the plurality of fins;
    dispensing diluted fluoride into the trench;
    dispensing deionized water into the trench subsequent to dispensing diluted fluoride;
    dispensing isopropanol into the trench subsequent to dispensing deionized water;
    solidifying the agent in the spaces; and
    transforming the solidified agent into vapor.

10. The method of claim 9, wherein a aspect ratio of the plurality of semiconductive fins is greater than 11.

11. The method of claim 9, wherein a Young's modulus of the plurality of semiconductive fins is lower than 200 GPa.

12. The method of claim 9, wherein a melting point of the agent is ranging from 0° C. to 25° C. under 1 atm.

13. The method of claim 12, wherein solidifying the agent is through lowering a temperature of the agent to at least 5 degrees below the melting point of the agent.

14. The method of claim 13, wherein solidifying the agent includes cooling the semiconductive substrate by purging a coolant on a surface of the semiconductive substrate.

15. A method for dehydrating a semiconductor structure, comprising:
    providing a semiconductive substrate;
    forming a trench array on the semiconductive substrate;
    dispensing an agent in liquid form into the trench array;
    dispensing diluted fluoride into the trench;
    dispensing deionized water into the trench subsequent to dispensing diluted fluoride;
    dispensing isopropanol into the trench subsequent to dispensing deionized water;
    solidify the agent;
    vaporizing the agent from solid form to vapor form inside a chamber; and
    providing superheated hydrogen oxide steam in the chamber.

16. The method of claim 15, wherein solidifying the agent is through lowering a temperature of the agent to at least 5 degrees below a melting point of the agent.

17. The method of claim 15, wherein the saturated vapor pressure of the agent under 1 atm and 5 degrees below the melting point is at least 1 kPa.

18. The method of claim 15, wherein vaporizing the agent includes lowering a partial vapor pressure of the agent in vapor form inside the chamber.

19. The method of claim 18, wherein the agent in vapor form is exhausted from the chamber.

20. The method of claim 18, wherein lowering the partial vapor pressure of the agent includes purging an inert gas into the chamber.

* * * * *